(12) United States Patent
Stockinger

(10) Patent No.: US 7,893,696 B2
(45) Date of Patent: Feb. 22, 2011

(54) PULSE CIRCUIT USING A TRANSMISSION LINE

(75) Inventor: Michael A. Stockinger, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 420 days.

(21) Appl. No.: 12/040,429

(22) Filed: Feb. 29, 2008

(65) Prior Publication Data

US 2009/0219038 A1    Sep. 3, 2009

(51) Int. Cl.
*G01R 31/11* (2006.01)

(52) U.S. Cl. ........................................ 324/534

(58) Field of Classification Search ........... 324/763, 324/534
See application file for complete search history.

(56) References Cited

U.S. PATENT DOCUMENTS

| | | | |
|---|---|---|---|
| 5,519,327 A | 5/1996 | Consiglio | |
| 5,804,977 A | 9/1998 | Consiglio | |
| 6,429,674 B1 | 8/2002 | Barth et al. | |
| 7,541,889 B2 * | 6/2009 | Maloney | 333/101 |
| 7,545,152 B2 * | 6/2009 | Grund | 324/605 |

* cited by examiner

*Primary Examiner*—Amy He
(74) *Attorney, Agent, or Firm*—Susan C. Hill

(57) ABSTRACT

A circuit is provided wherein a test pulse is provided to a device under test. A module allows the test pulse to pass through to the device under test. The module blocks a reflected pulse from passing through to the device under test when the reflected pulse has an opposite polarity from the polarity of the test pulse. In some cases, the reflected pulse may be detrimental to the device under test if it is not prevented from reaching the device under test. In one embodiment, when a second reflected test pulse is traveling away from the device under test, the module allows the second reflected test pulse to pass through.

20 Claims, 2 Drawing Sheets

PULSE CIRCUIT USING A TRANSMISSION LINE

BACKGROUND

1. Field

This disclosure relates generally to a pulse test circuit, and more specifically, to a pulse test circuit using a transmission line.

2. Related Art

A Transmission Line Pulse (TLP) test system is commonly used to characterize electrostatic discharge (ESD) protection devices using rectangular high voltage/current pulses. Pulse reflections can occur in the TLP system due to changes in the signal line impedance, for example at one end of the transmission line or at the device under test (DUT). These reflections can cause parasitic pulses at the DUT in addition to the main test pulse. If the DUT exhibits a strongly nonlinear behavior, for example a diode that has a low resistance in forward mode and a high resistance in reverse mode, a parasitic pulse of opposite polarity can destroy the DUT due to reverse breakdown before the TLP test sequence reaches the actual DUT failure level in forward mode. This poses a significant problem for TLP device characterization.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
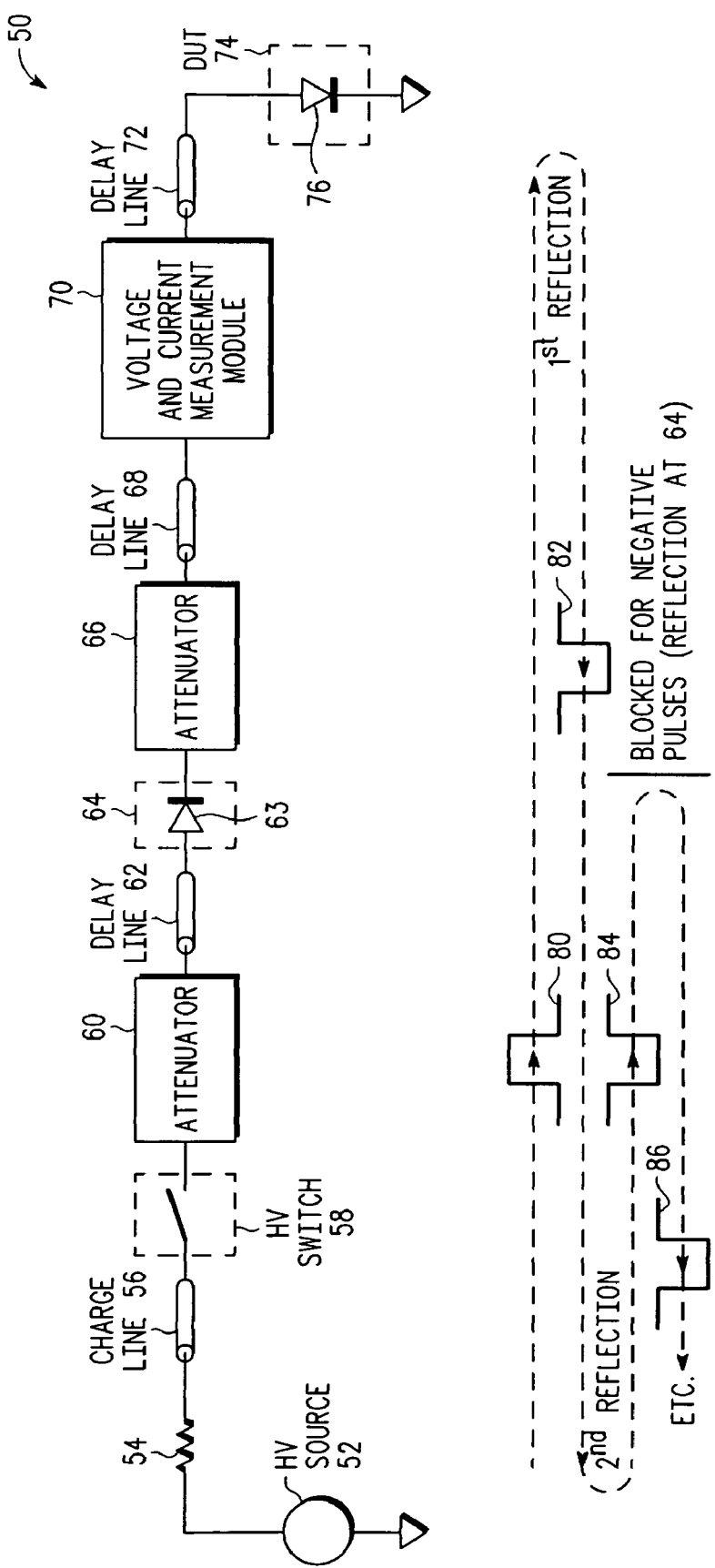
FIG. 1 illustrates, in partial schematic and partial block diagram form, a test circuit in accordance with one embodiment.

Referring to FIG. 1, pulse 80 represents a pulse produced by high voltage source 52, resistive element 54, charge line 56, and high voltage switch 58. In the illustrated embodiment, pulse 80 has positive voltage polarity and is transmitted to DUT 74 via attenuator 60, delay line 62, selective pulse blocking module 64, attenuator 66, delay line 68, voltage and current measurement module 70, and delay line 72. In this embodiment, the selective pulse blocking module 64 acts like a "through connection" for pulses with positive polarity (e.g. pulse 80) traveling from the charge line 56 towards the DUT 74. For pulse 80, which has positive voltage polarity, the DUT 74 exhibits a resistance that is lower than the system impedance (e.g. approximately 50 Ohms for one embodiment of test system 50) and therefore causes a reflected pulse 82 (first reflection) having opposite (i.e. negative) voltage polarity with respect to pulse 80. This first reflection is comparable to a reflection at a "short circuit" termination of a transmission line. The pulse 82 then travels back to the first terminal of charge line 56 where the signal path is terminated by resistive element 54 in series with the high voltage source 52. Note that the selective pulse blocking module 64 acts again like a "through connection", this time for pulses with negative polarity (e.g. pulse 82) traveling from DUT 74 towards the charge line 56.

Due to the high impedance of resistive element 54 (significantly higher than the system impedance), a reflected pulse 84 (second reflection) is produced, which has the same (i.e. negative) voltage polarity with respect to pulse 82. This second reflection is comparable to a reflection at an "open circuit" termination of a transmission line. Pulse 84 is now on its way back to DUT 74 where its reverse (i.e. negative) voltage polarity with respect to the original test pulse 80 could cause damage to DUT 74. Fortunately, selective pulse blocking module 64 can be used to block negative pulses coming from the charge line 56, so that pulse 84 is reflected back again as pulse 86. In this embodiment, the selective pulse blocking is achieved by module 64 acting as an "open circuit" termination of a transmission line for pulses with negative polarity traveling from the charge line 56 towards the DUT 74 and for pulses with positive polarity traveling from the DUT towards charge line 56. Pulses with positive polarity (e.g. pulse 80) traveling from the charge line 56 towards the DUT 74 and pulses with negative polarity (e.g. pulse 82) traveling from the DUT 74 towards the charge line 56 can pass through the selective pulse blocking module 64 without significantly altering the pulse shape or amplitude. In an alternate embodiment, any appropriate and desirable pulse shaping may be applied by the selective pulse blocking module 64. Note that without the blocking capability of selective pulse blocking module 64, pulse 84 would again reach the DUT 74, but with opposite (i.e. negative) polarity with respect to the original test pulse 80. Because of its opposite polarity, pulse 84 would likely damage DUT 74.

Referring to FIG. 1, parasitic pulses of opposite polarity in a TLP system (e.g. circuit 50) can destroy the DUT (e.g. 74) in reverse breakdown before the test sequence reaches the actual DUT failure level in forward mode. Damage due to parasitic pulses occurs when a low resistance nonlinear device (e.g. a diode 76) is characterized using a pulse test system (e.g. system 50). In such cases, the DUT (e.g. 74) receives a transmitted pulse 80 and causes a reflected pulse of opposite polarity (e.g. pulse 82) due to the mismatch between system impedance and DUT impedance at the DUT insertion point (comparable to a "short circuit" termination of a transmission line). The reflected pulse (e.g. pulse 82) then gets reflected a second time (e.g. as pulse 84) at the "open" end of the transmission line due to resistive element 54 causing a high termination resistance at the first terminal of the charge line 56. Note that pulse 84 keeps the same inverted polarity as pulse 82. Without the blocking capability of selective pulse blocking module 64, pulse 84 would again reach the DUT 74, but with opposite polarity with respect to the original test pulse 80. Due to the high resistance of DUT 74 in reverse mode, the voltage at the DUT 74 due to parasitic pulse 84 can be orders of magnitude higher than that due to the original test pulse 80, which likely leads to failure of DUT 74 (e.g. a reverse junction breakdown of diode 76). It is thus very important for some test circuits 50 to have a selective pulse blocking circuit 64 to reduce, block, or effectively eliminate the transmission of reflected pulse 84 to DUT 74.

Most conventional TLP systems have no way of avoiding the reflected pulse. In some TLP systems, attenuator 60 and/or attenuator 66 help a bit to reduce the intensity of the reflection by reducing its amplitude, but not enough to prevent premature leakage failures of diode 76 due to reverse breakdown. If selective pulse blocking module 64, comprising e.g. a series connected diode 63, was replaced with a parallel connected diode (not shown) having its first terminal coupled to ground and having its second terminal coupled to delay line 62 and attenuator 66, the parallel connected diode (not shown) could reflect the negative pulse 82 coming from DUT 74 and invert its polarity so that, once it arrives back at DUT 74, it has become a positive pulse again. Attenuator 66 would then help to gradually absorb the pulse "trapped" (traveling back and forth) between the parallel connected diode (not shown) and DUT 74. This method has the disadvantage of repetitive pulse stressing of DUT 74 as the main mode of testing. Furthermore, it requires an added rise time filter (not shown) somewhere between the charge line 56 and the parallel connected diode (not shown) to increase the pulse rise time so as to avoid negative spikes at DUT 74 due to the non-zero turn-on time and the parasitic capacitance of the parallel connected diode (not shown). Thus, the addition of a parallel connected diode (not shown) doesn't work for very short pulses (e.g. less than 5 nanoseconds) that require a fast pulse rise time.

Note that adding a termination network (e.g. a resistor in series with a diode) (not shown) at the first terminal of charge line 56 could be used to selectively absorb negative reflected pulses (e.g. pulse 82). However, this method requires a diode (not shown) that can sustain a very high voltage (e.g. 1 kilovolt or higher) that is applied to the charge line 56 for a long time during charging (i.e. before the actual pulse testing starts). Diodes that fit this high-voltage requirement typically also have high parasitic capacitance and slow turn-on time leading to non-rectangular pulses (e.g. for pulse 80) and reflected voltage spikes. Therefore, this termination network (not shown) may not work well for very short pulses (less than e.g. 10 nanoseconds) that require a fast pulse rise time and an approximately rectangular pulse shape. It is also difficult to fine-tune the total resistance of the termination network (not shown) to the system impedance (e.g. 50 Ohms) in order to fully absorb a reflected pulse (e.g. pulse 82) at any desired pulse amplitude. This is because the diode in series with the resistor of the termination network (not shown) exhibits a voltage dependent resistance due to its nonlinear forward conduction characteristic, thereby making the total termination resistance dependent on the pulse amplitude. Typically, a portion of the reflection still comes back to the DUT 74, potentially causing damage.

Note that closing high voltage switch 58 produces a single approximately rectangular pulse (80) that may be used in one embodiment as a test pulse to test an ESD circuit on DUT 74. In one embodiment, the test using pulse 80 is completed before HV switch 58 is opened again. Any number of closings of HV switch 58 may be used when testing DUT 74. Note that for the embodiment illustrated in FIG. 1, pulse 80 is a single approximately rectangular pulse having a single polarity (i.e. either positive as shown, or negative for an alternate embodiment). In other embodiments, any desired and appropriate pulse shape with one single polarity may be used. In one alternate embodiment, an approximately piecewise constant pulse shape may be used for pulse 80. In another embodiment, an approximately triangular pulse or piecewise linear pulse shape may be used. In other embodiments, exponentially increasing or decreasing pulse shapes may be used. In the illustrated embodiment, pulses 82, 84, and 86 are illustrated as having a negative polarity, and they all represent reflected pulses having their origin from the original pulse 80. In alternate embodiments of circuit 50, the opening of a switch may be used to produce a pulse. The phrase "transitioning a switch" will be used to mean changing the state of the switch, i.e. from being open to being closed, or from being closed to being open.

FIG. 1 illustrates, in partial schematic and partial block diagram form, a test circuit or test system 50 in accordance with one embodiment. In the illustrated embodiment, test system 50 comprises a high voltage source 52 having a first terminal coupled to a first power supply voltage (in the illustrated embodiment, the first power supply voltage is approximately ground). In the illustrated embodiment, the high voltage source 52 has a second terminal coupled to a first terminal of a resistive element 54. A second terminal of resistive element 54 is coupled to a first terminal of charge line 56. A second terminal of charge line 56 is coupled to a first terminal of high voltage switch 58. A second terminal of high voltage switch 58 is coupled to a first terminal of attenuator 60. A second terminal of attenuator 60 is coupled to a first terminal of delay line 62. A second terminal of delay line 62 is coupled to a first terminal of a selective pulse blocking module 64.

In one embodiment, selective pulse blocking circuit 64 comprises a semiconductor device 63. In one embodiment, selective pulse blocking circuit 64 comprises a p-n junction. In one embodiment, semiconductor device 64 comprises a diode. In yet another embodiment, semiconductor device 64 comprises a transistor with its control electrode coupled to one of its current electrodes, and in other embodiments, semiconductor device 64 comprises a transistor with its control electrode coupled and controlled in any desired and appropriate manner. In alternate embodiments, semiconductor device 64 may comprise additional elements (not shown) (e.g. one or more resistive elements, one or more capacitive elements, one or more inductive elements, or additional semiconductor devices). In one embodiment of test circuit 50, selective pulse blocking module 64 is used to selectively block pulses that have certain characteristics. In one embodiment, selective pulse blocking module 64 is used to prevent or inhibit pulses having one or more predetermined characteristics (e.g. negative polarity) from passing through circuit 64 in a selected direction (e.g. heading toward DUT 74).

In the illustrated embodiment, a second terminal of selective pulse blocking module 64 is coupled to a first terminal of attenuator 66. A second terminal of attenuator 66 is coupled to a first terminal of delay line 68. A second terminal of delay line 68 is coupled to a first terminal of voltage and current measurement module 70. A second terminal of voltage and current measurement circuit 70 is coupled to a first terminal of delay line 72. A second terminal of delay line 72 is coupled to a first terminal of DUT 74. And, a second terminal of DUT 74 is coupled to the first power supply voltage (in the illustrated embodiment, the first power supply voltage is approximately ground).

In some embodiments, DUT 74 is an integrated circuit. In the illustrated embodiment, DUT 74 is an integrated circuit that comprises a diode 76. In one embodiment, at least one purpose of diode 76 is to help protect circuitry on the integrated circuit from an ESD event. In alternate embodiments, DUT 74 may comprise any desired and appropriate ESD protection circuitry. In alternate embodiments, DUT 74 may be any type of electrical device.

The operation of one embodiment of circuit 50 of FIG. 1 will now be described in more detail. FIG. 1 illustrates one embodiment of a circuit 50 that can be used for testing an electrical device (e.g. DUT 74). In the illustrated embodiment, DUT 74 is tested by receiving a pulse of a predetermined amplitude and polarity. This predetermined amplitude and polarity may be changed from test to test. For some embodiment, the shape of the pulses is rectangular or approximately rectangular. Note that the term "rectangular" as used herein is intended to mean approximately rectangular. Alternate embodiments may vary the shape of the pulse if desired and useful. In one embodiment, the pulse amplitude may be increased between consecutive pulses from a voltage just above ground to an actual failure voltage of the DUT 74. Alternate embodiments may adjust the pulse amplitude in a different manner. In one embodiment, the purpose of test circuit 50 is to determine the DUT 74 voltage and/or current characteristics for each selected pulse amplitude and polarity. Alternate embodiments may use circuit 50 to test any desired characteristics of any desired type of electrical device. As one example, circuit 50 may be used to measure a time response or timing characteristic of DUT 74 (e.g. turn on time of an ESD protection device).

In one embodiment, circuit 50 eliminates parasitic pulses (i.e. pulses of opposite polarity with respect to the main test pulse) at the DUT 74 in a Transmission Line Pulse (TLP) test system. TLP systems such as system 50 are commonly used to characterize ESD protection devices using rectangular high amplitude pulses with very short pulse length (e.g. approximately 1 nanosecond to approximately 200 nanoseconds) and short pulse rise times (e.g. approximately 100 picoseconds to approximately 10 nanoseconds). Note that the term "pulse length", "pulse width", and "pulse duration" will be used interchangeably herein.

Referring again to FIG. 1, a high voltage source 52 in conjunction with a resistive element 54 is used to charge up charge line 56 to a desired voltage. Alternate embodiments may use any desired circuitry (e.g. a current source or any other source that can output an electrical charge) to charge up charge line 56 to a desired voltage. Any known or appropriate circuitry may be used to implement high voltage source 52 and resistive element 54. The voltage range of high voltage source 52 can be any desired range based on the desired pulse amplitude to be provided to the DUT 74. Resistive element 54 may be implemented using any electrical device that provides a resistance and that is able to function over the entire range of voltages. In one embodiment, the resistance value of resistive element 54 is orders of magnitude greater than the characteristic system impedance of test circuit 50. The characteristic system impedance of test circuit 50 may also be known as the signal path impedance. In one embodiment, the characteristic system impedance of test circuit 50 is approximately 50 Ohms. Alternate embodiments of test system 50 may have a different system impedance. Alternate embodiments may use any desired and appropriate value for resistive element 54.

In one embodiment, charge line 56 may be implemented as a transmission line (e.g. a coaxial cable) with a predetermined physical length that produces an approximately rectangular pulse having a predetermined pulse length when the high voltage switch 58 is closed. Alternate embodiments may implement charge line 56 using any desired and appropriate element(s). In one embodiment, the pulse length produced by charge line 56 is twice the signal delay time of charge line 56 if it was used as a transmission line. Alternate embodiments of charge line 56 may produce a pulse of any desired and appropriate shape and pulse length. For example, in one alternate embodiment, an approximately piecewise constant pulse shape may be used. The same embodiment may use a plurality of charge lines or charge line segments, similar to charge line 56, that are coupled together in order to achieve a desired pulse shape.

In one embodiment, high voltage switch 58 may be implemented as a relay. Alternate embodiments may implement high voltage switch 58 using any desired and appropriate element(s). In one embodiment, high voltage switch 58 is closed at the beginning of a pulse test and stays closed until that test is completed. Note that for one embodiment, high voltage switch 58 can handle the required high voltage, can provide a relatively clean pulse with minimum or no bouncing, can provide a fast pulse rise time, and inserts relatively little series resistance into the signal path. Alternate embodiments may have different characteristics. Note that in some alternate embodiments, high voltage source 52 and resistive element 54 may be coupled or connected to charge line 56 via a second switch terminal (not shown) of high voltage switch 58 while the switch is in the idle state and no test is being performed. In an alternate embodiment, any other circuitry that can produce electrical pulses (e.g. a pulse generator device) can be used instead of high voltage source 52, resistive element 54, charge line 56, and high voltage switch 58.

In one embodiment, attenuator 60 may be implemented in any known or appropriate manner to produce the desired signal attenuation. In one embodiment attenuator 60 is a high frequency component with a characteristic impedance that is approximately the same as the system impedance (e.g. 50 Ohms for one embodiment of test system 50). In one embodiment, attenuator 60 has a sufficiently large signal bandwidth (i.e. a sufficiently high cutoff frequency) in order to avoid changing the approximately rectangular pulse shape. In one embodiment, the attenuation of attenuator 60 is approximately constant over the entire signal bandwidth. In one embodiment, attenuator 60 provides an attenuation of approximately 6 decibels. In alternate embodiments, attenuator 60 may provide any desired and appropriate attenuation. In one embodiment, the attenuator 60 may be used to gradually absorb the energy of a reflected pulse (e.g. pulse 84) that gets trapped between the first terminal of charge line 56 and the selective pulse suppression module 64. In one embodiment, attenuator 60 may have a variable attenuation. In one embodiment this variable attenuation may be implemented by a plurality of attenuators (not shown) that can each be switched into the signal path using one or more high frequency relays (not shown). Some embodiments may use the variable attenuation of attenuator 60 to extend the available amplitude range of the test pulse (e.g. pulse 80) or to optimize the approximately rectangular shape of the test pulse by using the HV switch 58 in a desired (high) voltage range where the pulse shape reaches an optimum, even when a low amplitude of the test pulse is needed. In an alternate embodiment, attenuator 60 may not be present at all.

In one embodiment, delay line 62 may be implemented as a high frequency transmission line (e.g. a coaxial cable) with a predetermined physical length that inserts a predetermined signal delay. Alternate embodiments may implement delay line 62 using any desired and appropriate element(s). In one embodiment, the predetermined signal delay is at least half of the reverse recovery time of diode 63. As a result, a reflected pulse (e.g. pulse 84) reaches circuit 64 when the incoming pulse (e.g. pulse 82) has already passed through circuit 64 and diode 63 has fully recovered from the conduction mode caused by the incoming pulse (e.g. pulse 82). Alternate embodiments may determine the signal delay time of delay line 62 in any desired and appropriate manner. In one embodiment delay line 62 has a characteristic impedance that is approximately the same as the system impedance (e.g. 50 Ohms for one embodiment of test system 50). In an alternate embodiment, the delay line 62 may be inserted at a different location in the signal path of test system 50, e.g. coupled between HV switch 58 and attenuator 60.

In the illustrated embodiment, selective pulse blocking module 64 comprises a diode 63. Note that for the illustrated embodiment, diode 63 only has to handle a high current for the brief duration of the test pulse. Thus, a small diode 63 having a small parasitic junction capacitance and having a low turn-on resistance may be used. Note that the low turn-on resistance minimizes distortion and partial reflection of the test pulse caused by the slight change in signal line impedance due to the diode 63 that is inserted in series with the signal line. Note also that the small parasitic junction capacitance minimizes the amplitude of any unwanted pulse (not shown) (e.g. from pulse 84) that is not blocked but is transmitted on to DUT 74. Note that FIG. 1 does not even illustrate such an unwanted pulse (from pulse 84) that is not blocked but is transmitted on to DUT 74 because circuit 64 is effective at blocking almost all of the transmission of pulse 84.

By using a diode 63 that is in series with the signal path, rather than in parallel, it is possible to use very short duration pulses with very fast rise times. In one embodiment, this is because the parasitic junction capacitance of a parallel diode would limit the achievable pulse rise time. In alternate embodiments, selective pulse blocking module 64 may comprise any one or more electrical elements or circuitry that are able to block a pulse coming from one direction with a given polarity while allowing a pulse from the same direction but with the opposite polarity to pass through. In the illustrated embodiment, a diode 63 is used; however, alternate embodiments may use other appropriate non-linear elements or devices. Note that in the illustrated embodiment, diode 63 effectively functions like an "open circuit" termination (i.e. an electrical interruption of the signal line) while blocking a pulse (e.g. pulse 84) and like a "through connection" of the signal line while letting a pulse (e.g. pulses 80 and 82) pass through.

In one embodiment, attenuator 66 may be implemented in any known or appropriate manner to produce the desired signal attenuation. In another embodiment, attenuator 66 may be inserted at any desired point in the test system 50 between the selective pulse suppression module 64 and DUT 74. If the effective resistance of the DUT 74 is higher than the system impedance (e.g. diode 76 operated in forward mode below the turn-on voltage), the incoming pulse 80 gets reflected with the same (positive) voltage polarity (not shown) as the original pulse 80. This reflected pulse with positive polarity is blocked by the selective pulse suppression module 64, and reflected back towards the DUT 74 while keeping its positive polarity (not shown). The pulse gets trapped between the DUT 74 and the selective pulse suppression module 64. This may cause repetitive stressing of the DUT 74 with positive pulse polarity at low voltages (e.g. voltages lower than the turn-on voltage of diode 76). Attenuator 66 can be used to accelerate the decay of the trapped pulse amplitude thereby reducing the repetitive stressing of DUT 74. Note that this type of trapped pulse typically occurs only at very low pulse amplitude when the DUT is operated in a regime where it exhibits a higher effective resistance than the system impedance (e.g. before the pulse reaches the turn-on voltage of diode 76). At such low pulse amplitude, the repetitive stressing of DUT 74 is unlikely to cause its failure.

It should be noted that the trapped pulses disappear as soon as the DUT 74 reaches an effective resistance that is greater than the system impedance (e.g. when diode 76 turns on), which is typically the test regime of the greatest interest. In one embodiment attenuator 66 is a high frequency component with a characteristic impedance that is approximately the same as the system impedance (e.g. 50 Ohms for one embodiment of test system 50). In one embodiment, attenuator 66 has a sufficiently large signal bandwidth (i.e. a sufficiently high cutoff frequency) in order to avoid changing the approximately rectangular pulse shape. In one embodiment, the attenuation of attenuator 66 is approximately constant over the entire signal bandwidth. In one embodiment, attenuator 66 provides an attenuation of approximately 3 decibels. In alternate embodiments, attenuator 66 may provide any desired and appropriate attenuation. In one alternate embodiment, attenuator 66 may have a variable attenuation. In one embodiment this variable attenuation may be implemented by a plurality of attenuators (not shown) that can each be switched into the signal path using one or more high frequency relays (not shown). In one embodiment, the variable attenuation may be used to increase the available range of the test pulse amplitude (e.g. pulse 80) or to activate/deactivate attenuator 66 based on the effective resistance of DUT 74. In an alternate embodiment, attenuator 66 may not be present at all.

In one embodiment, delay line 68 may be implemented as a high frequency transmission line (e.g. a coaxial cable) with a predetermined physical length that inserts a predetermined signal delay. Alternate embodiments may implement delay line 68 using any desired and appropriate element(s). In one embodiment delay line 68 has a characteristic impedance that is approximately the same as the system impedance (e.g. 50 Ohms for one embodiment of test system 50). In an alternate embodiment, delay line 68 may not be present at all.

In one embodiment, voltage and current measurement module 70 may comprise a voltage and/or current probe for measuring the voltage and/or current of the test pulse (e.g. pulse 80) and/or the reflected pulse (e.g. pulse 82). Alternate embodiments of circuit 70 may comprise one or more relays for providing alternate connections to DUT 74. In one embodiment, one or more relays (not shown) may be used to selectively couple DUT 74 to a leakage measurement device (not shown) during a predetermined portion of a test (e.g. before and/or after pulse testing) in order to monitor the failure status of DUT 74. In one embodiment, circuit 70 comprises high frequency components with a characteristic impedance that is approximately the same as the system impedance (e.g. 50 Ohms for one embodiment of test system 50). In one embodiment, circuit 70 has a sufficiently large signal bandwidth (i.e. a sufficiently high cutoff frequency) in order to avoid changing the approximately rectangular pulse shape. In one embodiment, circuit 70 does not insert any significant signal attenuation or distortion. In another embodiment, circuit 70 may insert any appropriate and desired attenuation or distortion into the signal path of test system 50.

In one embodiment, delay line 72 may be implemented as a high frequency transmission line (e.g. a coaxial cable) with a predetermined physical length that inserts a predetermined signal delay. Alternate embodiments may implement delay line 72 using any desired and appropriate element(s). In one embodiment delay line 72 has a characteristic impedance that is approximately the same as the system impedance (e.g. 50 Ohms for one embodiment of test system 50). In one embodiment, the total signal delay due to delay line 68 in combination with delay line 72 is at least half of the pulse length plus half of the reverse recovery time of diode 63. As a result, a reflected pulse (e.g. pulse 82) reaches circuit 64 at a time when the incoming pulse (e.g. pulse 80) has already passed through circuit 64 and diode 63 has fully recovered from the conduction mode due to the incoming pulse (e.g. pulse 80). Alternate embodiments may determine the signal delay time of delay line 72 in any desired and appropriate manner. In one alternate embodiment, delay line 72 may not be present at all. Note that for some embodiments, the same type of transmission line (e.g. the same type of coaxial cable) may be used to implement charge line 56, delay line 62, delay line 68, and delay line 72. However, in alternate embodiments, different types of transmission lines may be used to implement one or more of charge line 56, delay line 62, delay line 68, and/or delay line 72.

Referring to FIG. 1, note that the first and second terminals of diodes 63 could be swapped, the first and second terminals of diode 76 could be swapped, and the polarities of pulses 80, 82, 84, and 86 could be swapped to produce an alternate embodiment of circuit 50 that works for a test pulse 80 that has an inverse polarity (i.e. negative polarity) to that illustrated in FIG. 1. The polarity of the high voltage source would also be reversed in order to provide a negative charge for charge line 56. This alternate embodiment of circuit 50 with negative test pulse polarity may be used for characterizing a DUT 74 containing a diode with grounded anode (not shown).

It should be noted that test system 50 has a common system ground coupled to the first power supply voltage (in the illustrated embodiment, the first power supply voltage is approximately ground). In one embodiment, the system ground is implemented by means of a conductive material that shields approximately the entire signal path starting from the first terminal of charge line 56 to the DUT 74. In the illustrated embodiment of FIG. 1, the ground terminals (not shown) of the individual system components of test system 50 are coupled together providing a continuous system ground. These ground terminals may be represented by, for example, the outer conductors of coaxial cables used for implementing charge line 56, delay lines 62, 68, and/or 72, the shielding cases of attenuators 60 and/or 66, the relay used for high voltage switch 58 or any other relays used in test circuit 50, the pulse suppression module 64, or the voltage and current measurement module 70. In one embodiment, connectors (not shown) that are used to couple the components of test system 50 carry the system impedance through the component connections and do not insert significant pulse distortion or signal loss into the signal path.

Figure 2:
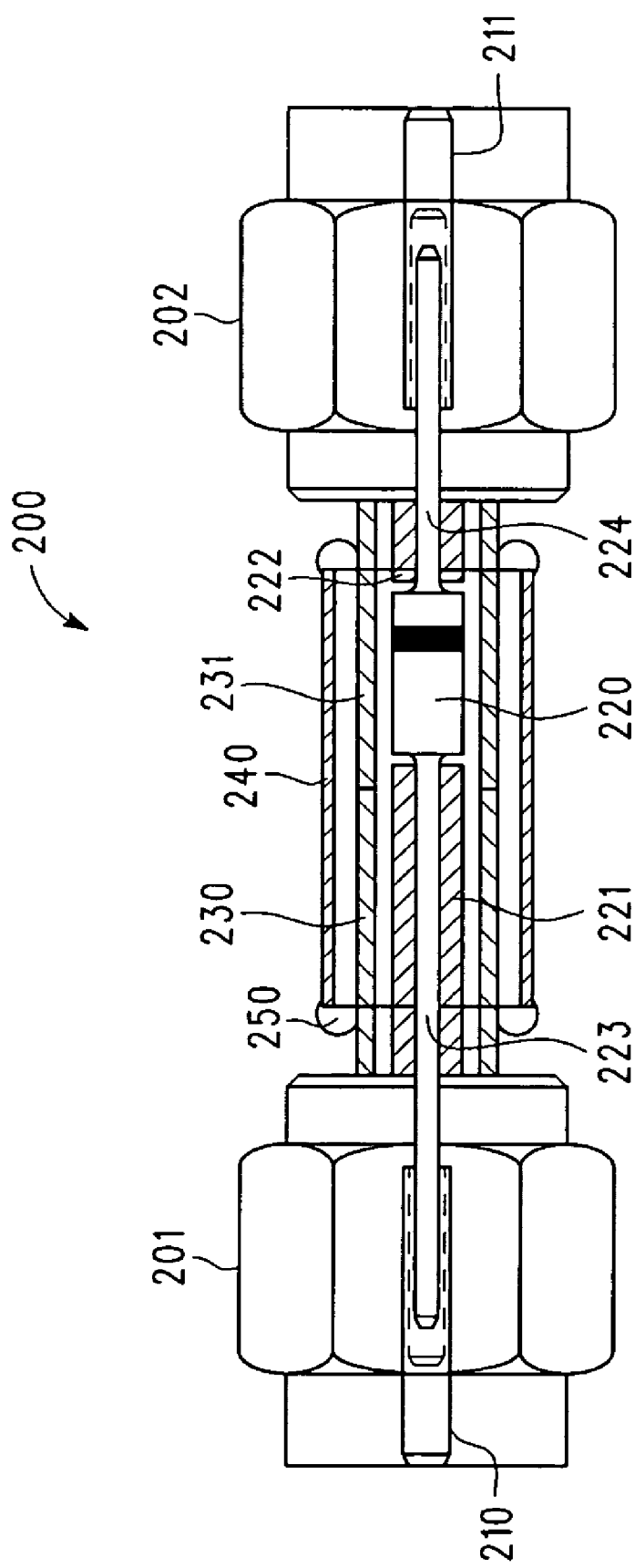
FIG. 2 illustrates, in cross-sectional view, a portion of the test circuit of FIG. 1 in accordance with one embodiment.

FIG. 2 illustrates, in partially cross-sectional view, a portion of the test circuit 50 of FIG. 1 in accordance with one embodiment. In one embodiment, device 200 of FIG. 2 may be used as an actual hardware implementation of the selective pulse suppression module 64 of FIG. 1. Alternate embodiments may implement the selective pulse suppression module 64 in any desired and appropriate way.

Referring to FIG. 2, device 200 comprises a first coaxial connector 201 with a signal pin 210 coupled to a first wire terminal 223 (anode) of a diode 220. A second wire terminal 224 (cathode) of diode 220 is coupled to a signal pin 211 of a second coaxial connector 202. Coaxial connector 201 includes a conductive tube 230 that is abutted and electrically coupled to a conductive tube 231 of coaxial connector 202. The conductive tube 230 is a part of the ground contact (i.e. casing) of coaxial connector 201 and the conductive tube 231 is a part of the ground contact (i.e. casing) of coaxial connector 202. Diode 220 is contained inside the void space formed by conductive tubes 230 and 231. A part of the first wire terminal 223 is surrounded by an insulator tube 221 and a part of the second wire terminal 224 of diode 220 is surrounded by an insulator tube 222. A shell 240 covers the merging area of conductive tubes 230 and 231 and holds them in place. The shell 240 is mechanically bonded to conductive tubes 230 and 231 by way of a bonding agent 250.

Referring to FIG. 2, the diode 220 is strapped between the two signal connectors 210 and 211. When device 200 is inserted into a signal path (e.g. the signal path of test system 50 of FIG. 1), diode 220 will be coupled in series with the signal path providing the functionality of the selective pulse suppression module 64 of FIG. 1. Referring back to FIG. 2, the coaxial connectors 201 and 202 provide a physical and electrical connection by means of signal pins 210 and 211 (inner conductors of the coaxial connector design) and the ground contacts (cases) of the connectors (outer conductor of the coaxial connector design). In alternate embodiments, connectors 201 and/or 202 may be implemented in any desired and appropriate manner.

In the illustrated embodiment, the first and second wire terminals 223 and 224 of diode 220 are inserted into cylindrical holes in signal pins 210 and 211, respectively, to establish a physical and electrical connection. In one embodiment, the wire terminals are soldered into the holes of the signal pins. In an alternate embodiment, the signal pins may be crimped onto the wire terminals. In other embodiments, any desired and appropriate means of electrically and physically coupling the wire terminals to the signal pins may be used. In the illustrated embodiment, the conductive tubes 230 and 231 are abutted and form a void space that contains the diode 220. In one embodiment, this void space is electrically shielded from the outside by means of the conductive tubes, which also serve as the ground connection between connectors 201 and 202. To hold the conductive tubes 230 and 231 in place, a shell 240 is slid over them and bonded to the conductive tubes by way of the bonding agent 250.

In one embodiment, the conductive tubes 230, 231 may comprise metal. In other embodiments, the conductive tubes 230, 231 may comprise any one or more desirable and appropriate materials that provide for electrical conductivity. In one embodiment, the shell 240 may comprise an electrically conductive material; in some embodiments, that conductive material may comprise one or more metals. In other embodiments, the shell 240 may consist of any desirable and appropriate material (e.g. an insulator). In one embodiment, the bonding agent 250 that is used to bond together the conductive tubes 230 and 231 with the shell 240 may be solder. In another embodiment, the bonding agent 250 may contain glue or any other desirable and appropriate material.

In one embodiment, the segments of the wire terminals 223 and 224 of diode 220 that reside within the conductive tubes 230 and 231, respectively, form transmission lines between the connectors 201 and 202 and the two sides of diode 220. Due to their specific dielectric constants, the insulating tubes 221 and 222 may be used to adjust the characteristic impedance of these transmission lines to any desired system impedance. In one embodiment, the characteristic impedance of these transmission lines is approximately equal to the system impedance of test system 50 of FIG. 1 in order to minimize parasitic reflections and/or signal losses that may occur at a point in the signal line where the characteristic impedance changes. In one embodiment the insulating tubes 221, 222 may have a dielectric constant that is greater than that of air; and thus inserting them into the space between the inner conductors (formed by wire terminals 223 and 224 of diode 220) and the outer conductors (formed by conductive tubes 230 and 231) may decrease the characteristic impedance of the corresponding transmission line segments. In other embodiments, the insulating tubes may have any desired and appropriate length and thickness and dielectric constant, and may be made of any desired and appropriate material or combination of materials. In the illustrated embodiment, the diode 220 is shown having a cylindrical shape. Other embodiments of this invention may use any other appropriate physical shape and size of diode 220.

While in the illustrated embodiment of FIG. 2 the device 200 has its connectors arranged in a straight manner with connector 201 facing into one direction and connector 202 facing into the opposite direction, alternate embodiments may use a different overall shape of device 200. In one alternate embodiment, the two connectors may be arranged in a 90 degree angled configuration. In other embodiments, any desired and appropriate angle and physical shape of device 200 may be used. In the illustrated embodiment, coaxial connectors are used. Other embodiments may use any other type of connectors. In the illustrated embodiment, a coaxial design is used for device 200. In alternate embodiments, device 200 may be implemented as a micro-strip module or built on a printed circuit board. In other embodiments, any desirable and appropriate implementation of device 200 that contains diode 220 and provides external connectors for the terminals of diode 220 may be used.

By now it should be appreciated that there has been provided, in one embodiment, a pulse test circuit that comprises one or more components that reduce or effectively eliminate the negative effects of parasitic pulses.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, circuit 64 may comprise one or more additional circuit elements, or alternately may comprise a transistor. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method, comprising:
   providing a signal path between a voltage source and a device under test;
   providing a switch in the signal path;
   providing a pulse blocking circuit in series with the switch in the signal path;
   transitioning the switch to generate a test pulse;
   allowing the test pulse to pass through to the device under test, wherein the test pulse has a first polarity;
   allowing a reflected pulse to pass through from the device under test, wherein the reflected pulse has a second polarity, and wherein the second polarity is an opposite polarity from the first polarity;
   blocking a second reflected pulse, using the pulse blocking circuit, from passing through to the device under test, wherein the second reflected pulse has the second polarity; and
   testing at least a portion of the device under test using the test pulse.

2. A method as in claim 1, wherein the step of testing comprises:
   testing an electrostatic discharge protection circuit on the device under test using the test pulse.

3. A method as in claim 1, wherein the device under test comprises a nonlinear device.

4. A method as in claim 1, wherein the device under test comprises a diode.

5. A method as in claim 1, wherein the test pulse and the reflected pulse are traveling in an opposite direction.

6. A method as in claim 1, wherein the test pulse and the second reflected pulse are traveling in a same direction.

7. A method as in claim 1, wherein the test pulse and the reflected pulse are rectangular.

8. A method as in claim 1, wherein the test pulse has a duration less than 10 nanoseconds.

9. A circuit, comprising:
   a pulse source for providing a pulse;
   a protected device;
   one or more line segments for transmitting the pulse from the pulse source to the protected device, for transmitting a first reflected pulse from the protected device to the pulse source, and for transmitting a second reflected pulse from the pulse source to the protected device, wherein the pulse has a first polarity, and wherein the first reflected pulse and the second reflected pulse have a second polarity, wherein the first and second polarities are opposite polarities; and
   a module coupled in series between the pulse source and the protected device, the module allowing the pulse to pass through, the module allowing the first reflected pulse to pass through, and the module blocking the second reflected pulse.

10. A circuit as in claim 9, wherein the module comprises a p-n junction.

11. A circuit as in claim 9, wherein the module comprises a diode.

12. A circuit as in claim 9, wherein the pulse and the second reflected pulse are traveling in a first direction, and wherein the first reflected pulse is traveling in a second direction that is opposite from the first direction.

13. A circuit as in claim 9, further comprising:
    one or more attenuators coupled in series with the module.

14. A circuit as in claim 9, further comprising:
    a measurement module for measuring one of voltage or current, or for measuring both voltage and current.

15. A circuit as in claim 9, wherein the one or more line segments comprise one or more delay lines to prevent the pulse, the first reflected pulse, and the second reflected pulse from overlapping at the module.

16. A circuit as in claim 9, wherein the module comprises:
    a diode; and
    electrical shielding surrounding more than half of the diode.

17. A circuit as in claim 16, further comprising:
    a first coaxial connector coupled to a first terminal of the diode; and
    a second coaxial connector coupled to a second terminal of the diode.

18. A circuit as in claim 17, further comprising:
    a first insulating tube at least partially surrounding the first terminal of the diode; and
    a second insulating tube at least partially surrounding the second terminal of the diode.

19. A circuit, comprising:
    a pulse source for providing a first pulse;
    a device under test;
    a module coupled in series between the pulse source and the device under test, the module allowing the first pulse to pass through when the first pulse has a first polarity and is traveling toward the device under test, the module allowing a second pulse to pass through when the second pulse has a second polarity and is traveling away from the device under test, and the module stopping a third pulse from passing through when the third pulse has the second polarity and is traveling toward the device under test, wherein the first polarity and the second polarity are opposite polarities;
    wherein the module comprises:
    a diode having a first terminal coupled to the pulse source and having a second terminal coupled to the device under test;

a first insulating tube at least partially surrounding the first terminal of the diode;

a second insulating tube at least partially surrounding the second terminal of the diode;

a first coaxial connector coupled to a first terminal of the diode; and a second coaxial connector coupled to a second terminal of the diode.

20. A circuit as in claim 19, wherein the device under test further comprises:

an electrostatic discharge protection circuit.

* * * * *